US010663627B1

(12) United States Patent
Jia et al.

(10) Patent No.: US 10,663,627 B1
(45) Date of Patent: May 26, 2020

(54) SELECTIVE COATING FOR FRESNEL SURFACE

(71) Applicant: Facebook Technologies, LLC, Menlo Park, CA (US)

(72) Inventors: Zhang Jia, San Jose, CA (US); Shizhe Shen, Foster City, CA (US); Kurt Allen Jenkins, Sammamish, WA (US)

(73) Assignee: Facebook Technologies, LLC, Menlo Park, CA (US)

(*) Notice: Subject to any disclaimer, the term of this patent is extended or adjusted under 35 U.S.C. 154(b) by 55 days.

(21) Appl. No.: 15/938,166

(22) Filed: Mar. 28, 2018

(51) Int. Cl.
| *G02B 3/08* | (2006.01) |
| *G02B 1/04* | (2006.01) |
| *B05D 5/06* | (2006.01) |
| *B05D 1/32* | (2006.01) |
| *B05D 3/12* | (2006.01) |
| *B05D 1/18* | (2006.01) |
| *B05D 3/10* | (2006.01) |
| *B29D 11/00* | (2006.01) |
| *B05D 1/00* | (2006.01) |
| *B29K 33/00* | (2006.01) |

(52) U.S. Cl.
CPC ............... *G02B 3/08* (2013.01); *B05D 1/005* (2013.01); *B05D 1/18* (2013.01); *B05D 1/322* (2013.01); *B05D 3/101* (2013.01); *B05D 3/12* (2013.01); *B05D 5/06* (2013.01); *B29D 11/00269* (2013.01); *B29D 11/00865* (2013.01); *G02B 1/041* (2013.01); *B29K 2033/12* (2013.01)

(58) Field of Classification Search
CPC .................. G02B 3/08; G02B 27/0172; G02B 2027/0138; B05D 1/005; B29C 43/52; B29C 45/0053; B29C 45/7207; B29C 11/00269; B29C 11/0048; B29C 2045/0079
USPC .................... 264/1.35, 2.5, 2.7; 359/457, 742
See application file for complete search history.

(56) References Cited

U.S. PATENT DOCUMENTS 5,676,804 A * 10/1997 Fujii ....................... C23C 14/04
204/192.14

* cited by examiner

*Primary Examiner* — William Choi
(74) *Attorney, Agent, or Firm* — Freestone Intellectual Property PLLC; Aaron J. Visbeek

(57) ABSTRACT

A Fresnel optical element includes a Fresnel surface formed in a material. The Fresnel surface includes a plurality of Fresnel feature that include an active surface and a draft surface. A light absorptive layer is selectively disposed over the draft surface of the Fresnel features. The light absorptive surface is configured to absorb a majority of visible light encountering the light absorptive layer.

18 Claims, 12 Drawing Sheets

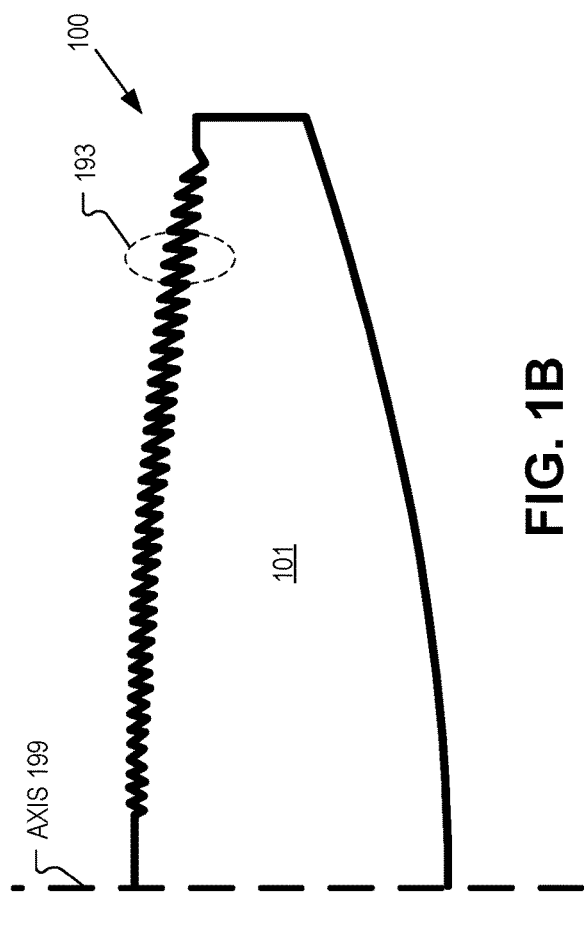
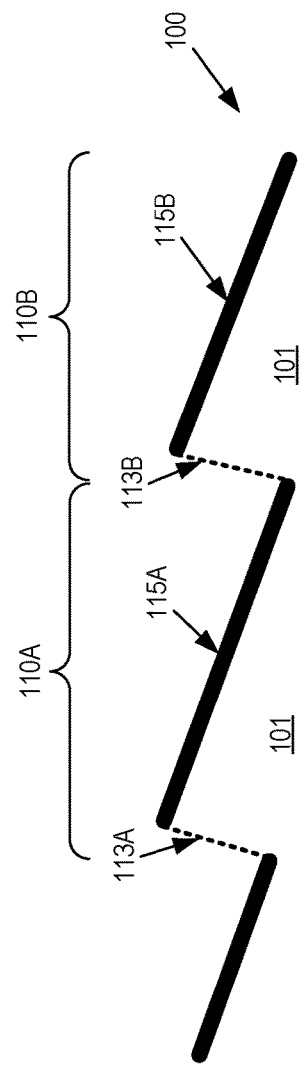
FIG. 1B
FIG. 1C

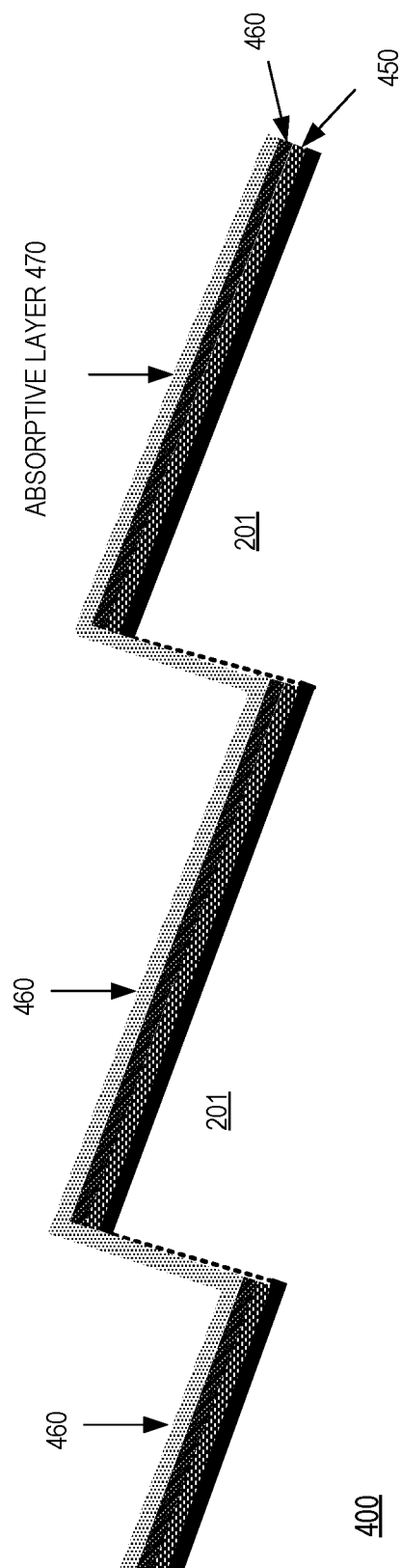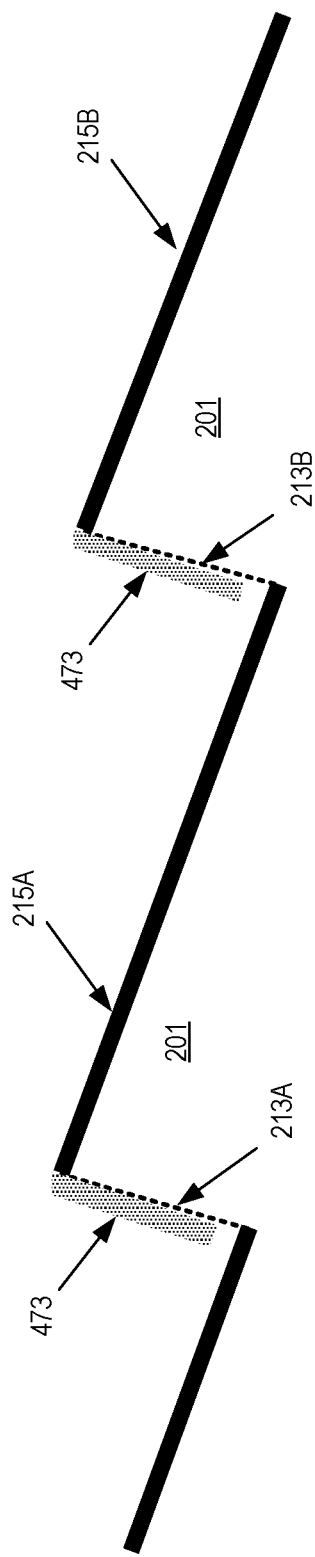

US 10,663,627 B1

SELECTIVE COATING FOR FRESNEL SURFACE

TECHNICAL FIELD

This disclosure relates generally to optics and in particular to but not exclusively to Fresnel surfaces of optical components.

BACKGROUND INFORMATION

Lenses and other optical elements are ubiquitous in both consumer and commercial products such as cameras, displays, and sensors. Fresnel lenses were famously developed in the early 1800s and originally deployed in lighthouses to increase the distance that the light from the lighthouse could be viewed by ships. Using Fresnel lenses can be advantageous in that they are thinner (and often lighter) than conventional lenses with similar optical power. Yet, many design tradeoffs are involved in the engineering and fabrication of Fresnel lenses and improving the design of Fresnel optical elements for specific contexts is desirable.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIGS. 1A-1C include a Fresnel optical element having Fresnel features that include an active surface and a draft surface, in accordance with an embodiment of the disclosure.

FIGS. 4A-4F illustrate an example process of fabricating a Fresnel optical element using a thiol layer to selectively apply absorptive polystyrene on the draft surfaces of the Fresnel optical element, in accordance with an embodiment of the disclosure.

DETAILED DESCRIPTION

Embodiments of Fresnel optical elements and processes of fabricating Fresnel optical elements having light absorptive layers on the drafts surfaces are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The Fresnel optical elements and processes of fabricating Fresnel optical elements having absorptive layers on the draft surfaces are described in this disclosure. Conventional Fresnel lenses include Fresnel features including an active surface and a draft surface. The active surface is the surface that is designed to achieve the desired lensing characteristics of the Fresnel lens while the draft surface is a passive surface that serves to break the active surfaces into segments. Fresnel optical elements with draft surfaces that are selectively coated with an absorptive material are disclosed in this application. Methods of fabricating Fresnel optical elements with an absorptive layer on the draft surfaces are also disclosed. By applying an absorptive layer to the draft surfaces, glare and double imaging generated from the Fresnel optical element may be reduced and therefore improve optical systems that the Fresnel optical element is used in. These and other embodiments are described in more detail with reference to FIGS. 1A-6.

Figure 1A:
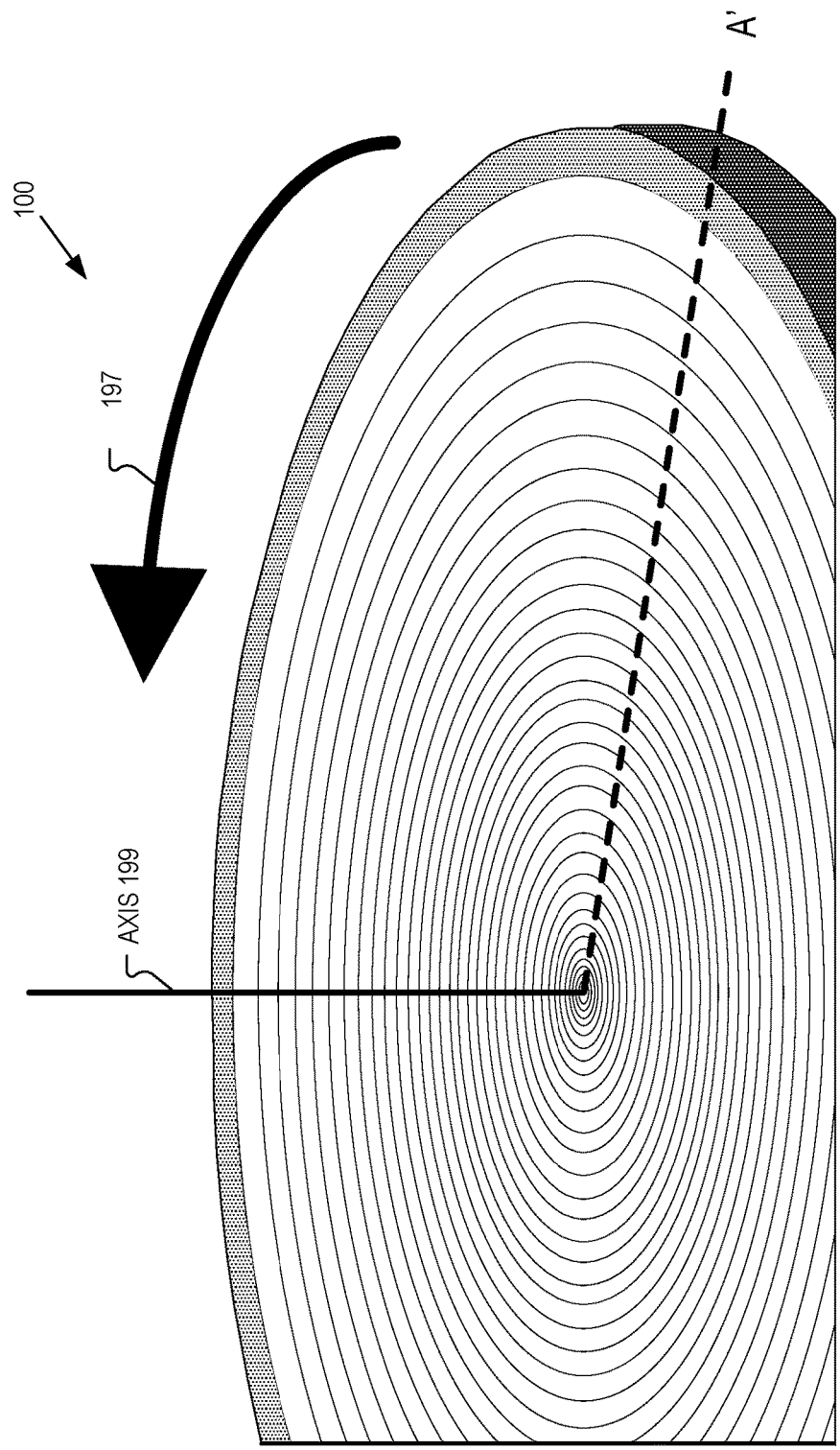

FIGS. 1A-1C include a Fresnel optical element having Fresnel features that include an active surface and a draft surface, in accordance with an embodiment of the disclosure. In FIG. 1A, example Fresnel optical element 100 includes a Fresnel surface including a plurality of Fresnel features. Fresnel optical element 100 is rotationally symmetric around a central axis 199, in the illustrated embodiment.

FIG. 1B illustrates a cross-section view of the Fresnel optical element 100 through the line A' illustrated in FIG. 1A. FIG. 1B illustrates that the Fresnel features of the Fresnel surface may increase in size as a distance of the Fresnel feature increases from the central axis 199 increases. The Fresnel features are formed in a refractive material 101, in FIG. 1B. In one embodiment, the refractive material 101 includes poly-methyl-methacrylate (PMMA). Other plastic and glass refractive materials may also be used as refractive material 101.

FIG. 1C illustrates a zoomed-in view of view 193 of FIG. 1B. FIG. 1C includes Fresnel features 110A and 110B. Fresnel features 110 each include a draft surface 113 (dashed lines) and an active surface 115 (solid line). Although only two Fresnel features are illustrated as examples throughout the disclosure, those skilled in the art understand that each Fresnel optical element may have many more Fresnel features 110 and that the techniques disclosed herein may be applied to all of the Fresnel features in a Fresnel optical element.

Figure 2A:
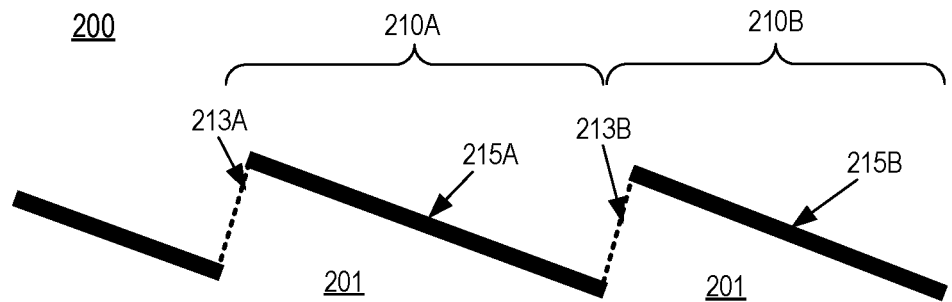
FIGS. 2A-2F illustrate an example photolithography process of fabricating a Fresnel optical element having a light absorptive layer on the draft surfaces of the Fresnel optical element, in accordance with an embodiment of the disclosure.

FIGS. 2A-2F illustrate an example photolithography process of fabricating a Fresnel optical element 200 having a light absorptive layer on the draft surfaces of the Fresnel optical element, in accordance with an embodiment of the disclosure. FIG. 2A illustrates a Fresnel surface that includes Fresnel features 210A and 210B. Fresnel feature 210A includes a draft surface 213A (dashed lines) and an active surface 215A (solid line). Fresnel feature 210B includes a draft surface 213B (dashed lines) and an active surface 215B (solid line). The Fresnel features 210 are formed in a refractive material 201, in FIG. 2A.

Figure 2B:
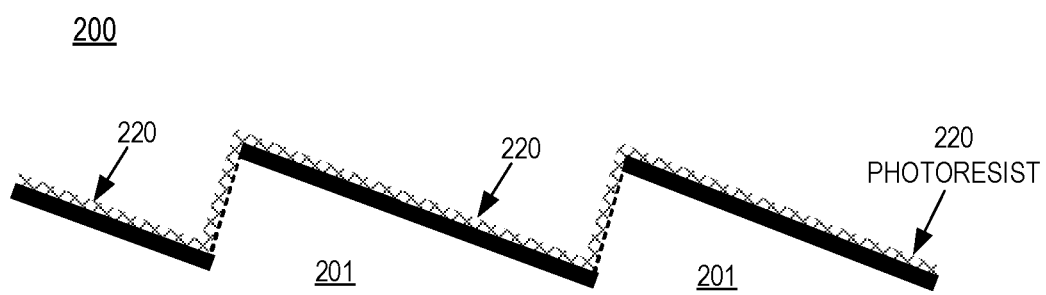

In FIG. 2B, a photoresist layer 220 is formed on the draft surfaces 213 and active surfaces 215 of the Fresnel features 210.

Figure 2C:
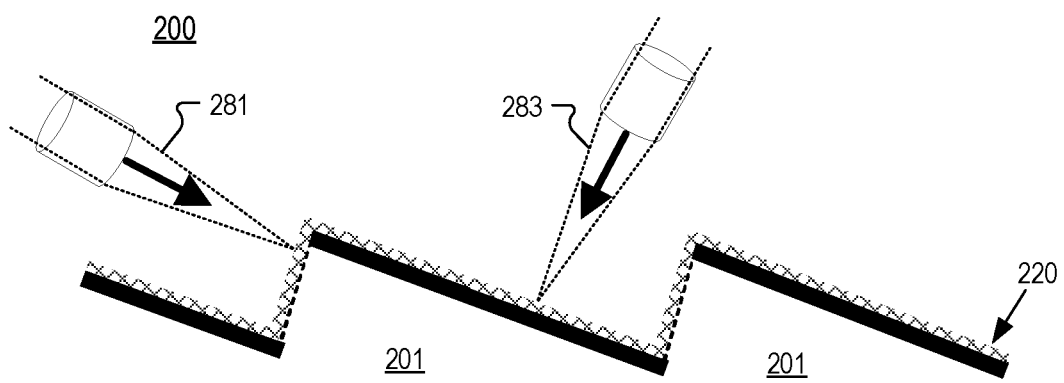

In FIG. 2C, a controlled light source is activated to selectively remove the photoresist layer 220 on the draft surfaces 213. A controlled light source 283 illuminates the active surfaces 215 but not the draft surfaces 213 when a negative photoresist is used as photoresist layer 220 so that the draft surfaces 213 that were not exposed to the controlled light source 283 are dissolved by a photoresist developer that is applied subsequently. The Fresnel optical element 200 may be rotated in a direction 197 (FIG. 1A) about its central axis 199 while the controlled light source 283 illuminates one or more draft surfaces 213 of the optical element 200.

A controlled light source 281 illuminates the draft surfaces 213 but not the active surfaces 215 when a positive photoresist is used as photoresist layer 220 so that the draft surfaces 213 that are exposed to the controlled light source 281 dissolved by a photoresist developer that is applied subsequently. In one embodiment, controlled light source 281 is incident upon the Fresnel optical element 200 at an angle where the active surfaces 215 are in the shadow of the draft surfaces 213 (and therefore not exposed to controlled light source 281). The Fresnel optical element 200 may be rotated in a direction 197 (FIG. 1A) about its central axis 199 while the controlled light source 281 illuminates the draft surfaces 213. In this way, the controlled light source 281 may remain in a fixed position while the Fresnel optical element 200 is rotated to illuminate the draft surfaces 213. Controlled light sources 281 and 283 may include ultraviolet (UV) light.

The technique of rotating the optical element 200 while the controlled light source 281/283 is activated may increase precision, increase yield because of manufacturing uniformity due to repeatability and therefore decrease the manufacturing cost of Fresnel optical element 200. The described technique may also reduce tooling cost and/or time of the photolithography process described by FIGS. 2A-2F.

Figure 2D:
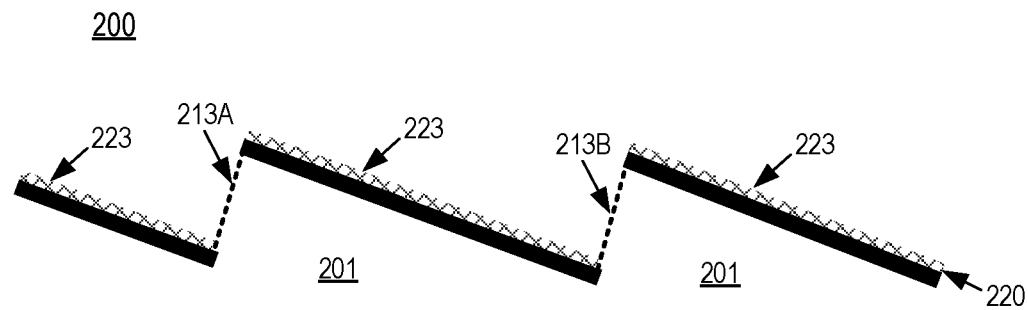

In FIG. 2D, a photoresist developer has been applied so that the photoresist layer 220 has been removed from the draft surfaces 213 and the active surface photoresist portion 223 remains over the active surfaces 215.

Figure 2E:
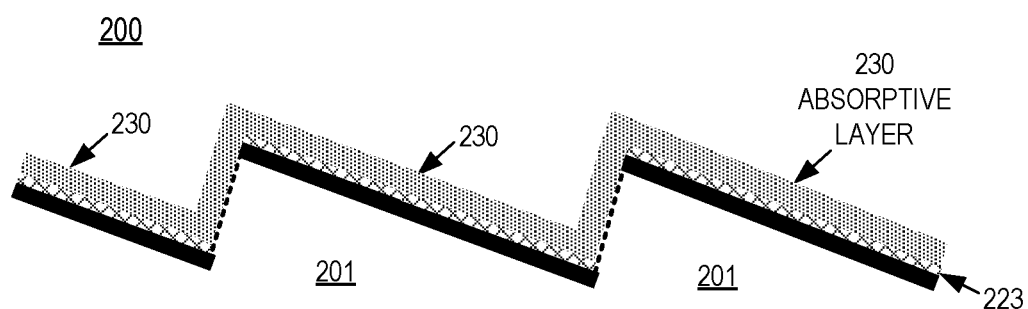

In FIG. 2E, a light absorptive layer 230 is applied to the Fresnel features. The light absorptive layer 230 is disposed over the active surface photoresist layer 223 that remains over the active surfaces 215. Light absorptive layer 230 is also disposed on the draft surfaces 213, in the illustrated embodiment. The light absorptive layer 230 may absorb light in the visible and the infrared spectrum so that the light will not propagate into the refractive material 201 of optical element 200. In one embodiment, absorptive layer 230 possesses a matte surface to further reduce reflections of incident light and therefore further reduce glare and resulting double imaging from optical element 200. In one embodiment, the light absorptive layer 230 is a black colored layer similar to the black matrix material commonly used in the color filter glass of liquid crystal displays. The black matrix material may be a resin filled with black pigment. In one embodiment, light absorptive layer 230 includes a resin with black pigment and photosensitive agents (for photoresist techniques) dispersed and dissolved in the resin. In one embodiment, forming the light absorptive layer 230 on the Fresnel surface includes spin coating the light absorptive layer 230 onto the Fresnel optical element 200. In one embodiment, forming the light absorptive layer 230 on the Fresnel surface includes dip coating the Fresnel optical element 200 in a light absorptive material. Electroplating or other suitable deposition technique may also be used to form light absorptive layer 230 on the Fresnel surface.

Figure 2F:
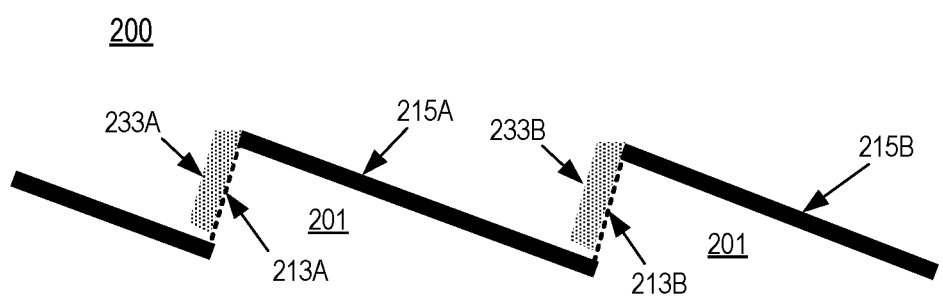

In FIG. 2F, the active surface photoresist layer 223 remaining on the active surfaces 215 are removed (washed out) where removing the active surface photoresist layers 223 also removes the portion of the light absorptive layer 230 that was disposed on the remaining layers 223. Hence, draft surface light absorptive layer 233A remains on draft surface 213A and draft surface light absorptive layer 233B remains on draft surface 213B. Fresnel optical element 200 in FIG. 2F thus illustrates a Fresnel optical element having the draft surfaces 213 selectively coated by absorptive layers 233 while the active surfaces 215 are not coated with the light absorptive layer 230.

Figure 3A:
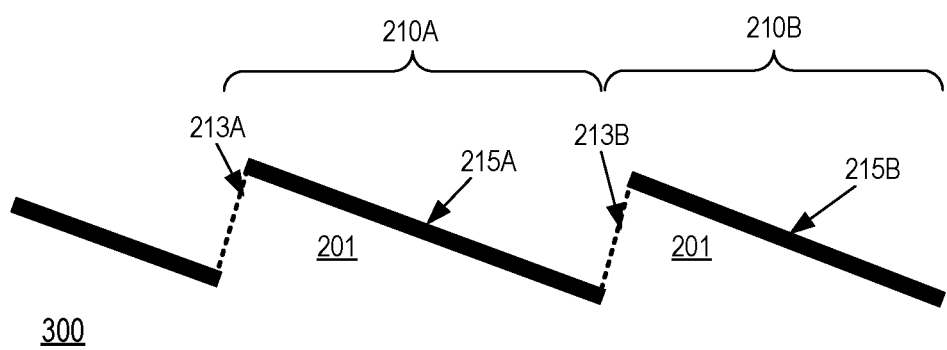
FIGS. 3A-3D illustrate an example process of fabricating a Fresnel optical element having a light absorptive photoresist layer on the draft surfaces of the Fresnel optical element, in accordance with an embodiment of the disclosure.

FIGS. 3A-3D illustrate an example process of fabricating a Fresnel optical element 300 having a light absorptive photoresist layer on the draft surfaces of the Fresnel optical element, in accordance with an embodiment of the disclosure. FIG. 3A illustrates a Fresnel surface that includes Fresnel features 210A and 210B, as in FIG. 2A.

Figure 3B:
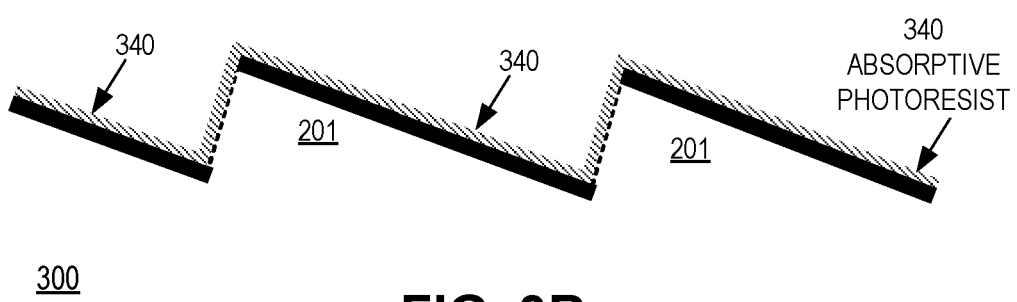

In FIG. 3B, a light absorptive photoresist layer 340 is formed on the Fresnel surface that includes Fresnel features 210. Light absorptive photoresist layer 340 may be formed onto Fresnel optical element 300 in a spin coating procedure, in some embodiments. Other suitable deposition processes may be used to form layer 340 on the Fresnel surface. Light absorptive photoresist layer 340 is a material that is both a black coating and a photoresist. In one embodiment, layer 340 includes FujiFilm Black SK-3000L.

Figure 3C:
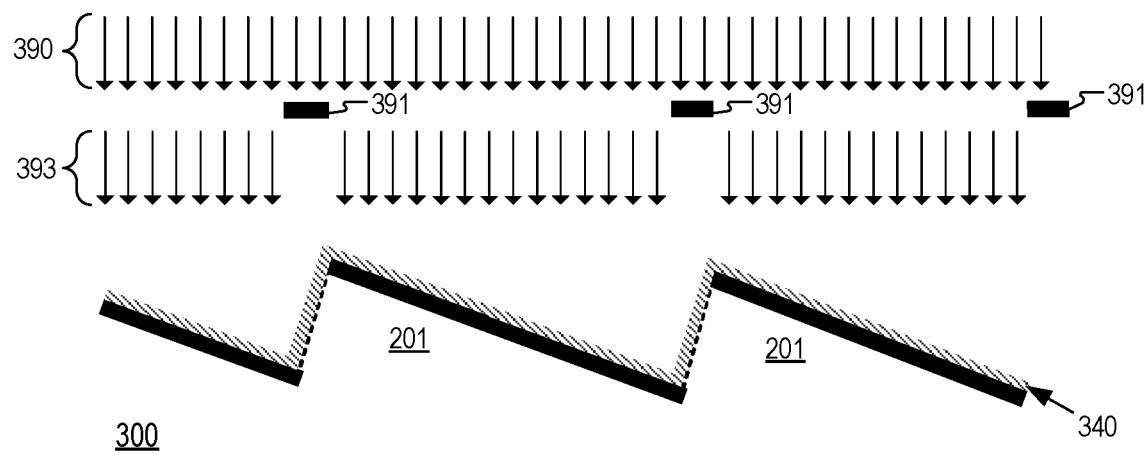
Figure 3D:
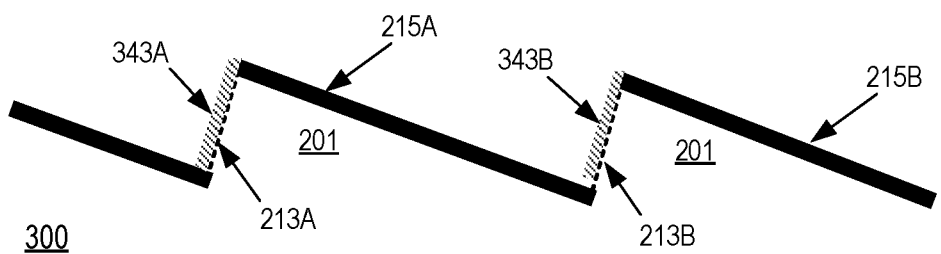

In FIG. 3C, patterned light 393 illuminates optical element 300 to selectively remove the light absorptive photoresist layer 340 from the active surfaces while leaving the portions 343A and 343B of the light absorptive photoresist layer 340 on the draft surfaces (FIG. 3D). After light absorptive photoresist layer 340 is illuminated by patterned light 393 in FIG. 3C, a developer may be applied so that only the draft surfaces 213A and 213B retain portions 343A and 343B of the light absorptive photoresist layer 340, as illustrated in FIG. 3D. FIG. 3C shows that a photomask 391 may be utilized to impart a pattern to source light 390 and generate patterned light 393. In one embodiment, the controlled light sources 281 and 283 and techniques described in association with FIGS. 2A-2F may be used to pattern the light absorptive photoresist layer 340. In one embodiment, a precise light beam width is used to expose the active surfaces 215 to UV light while the optical element 300 is rotating about its central axis.

Figure 4A:
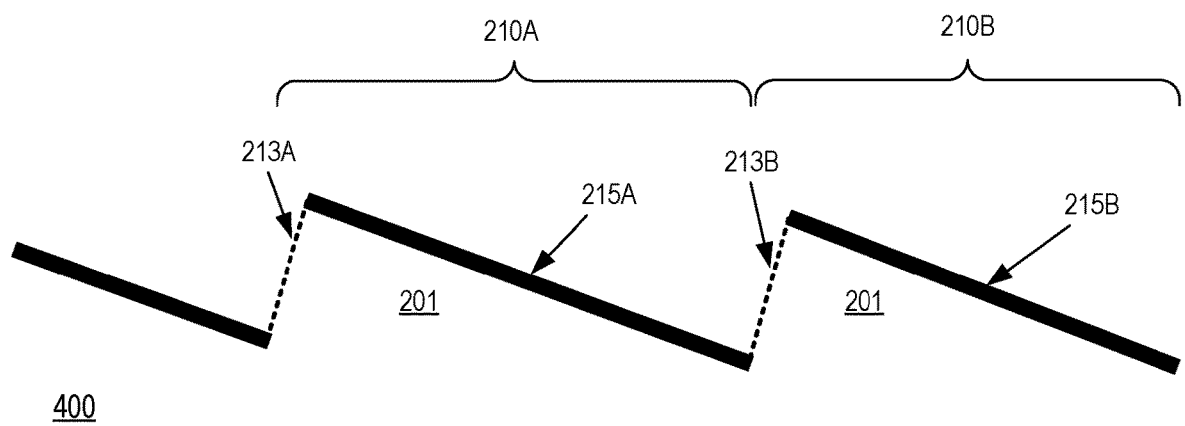

FIGS. 4A-4F illustrate an example process of fabricating a Fresnel optical element using a thiol layer to selectively apply absorptive polystyrene on the draft surfaces of the Fresnel optical element, in accordance with an embodiment of the disclosure. FIG. 4A illustrates a Fresnel surface that includes Fresnel features 210A and 210B, as in FIG. 2A.

Figure 4B:
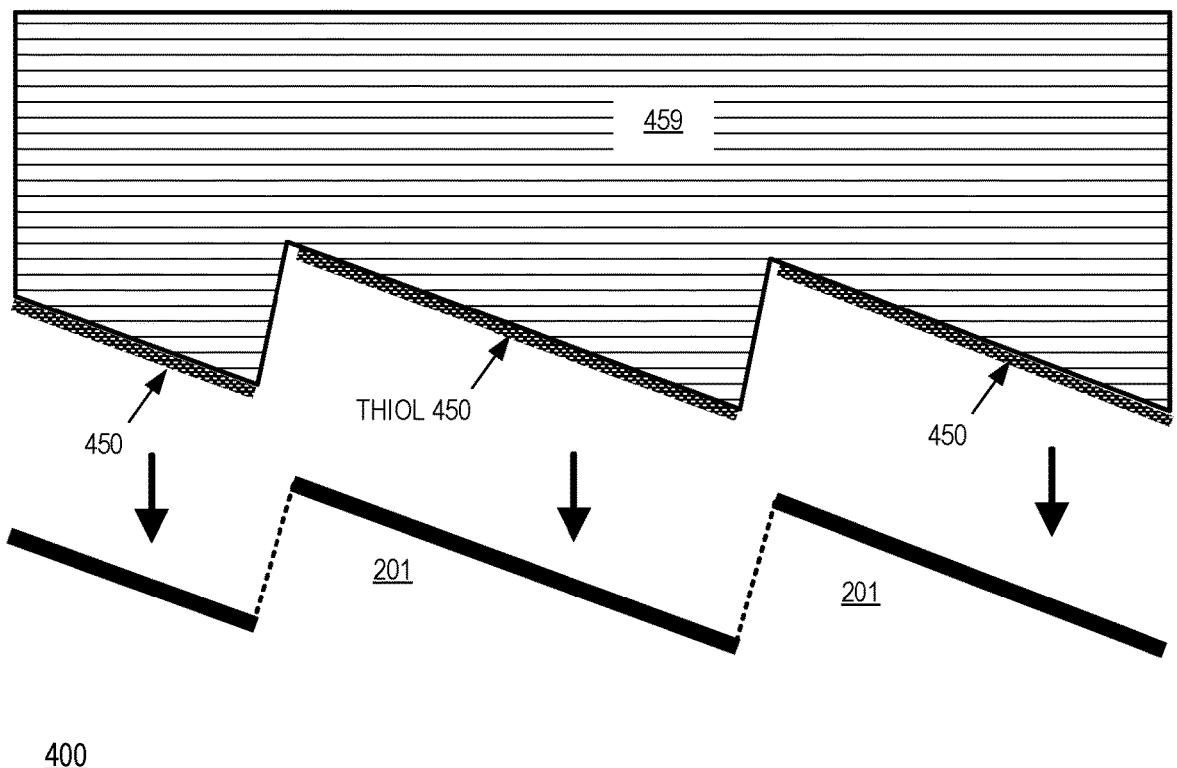

In FIG. 4B, a stamp 459 is coated with a thiol layer 450 for transferring to the active surfaces 215 of the Fresnel features of optical element 400. Stamp 459 is configured to apply the thiol layer 450 to the active surfaces 215 of optical element and not apply the thiol layer 450 to the draft surfaces 213. Other methods of applying the thiol layer 450 to the active surfaces 215 of optical element 400 may be used.

Figure 4C:
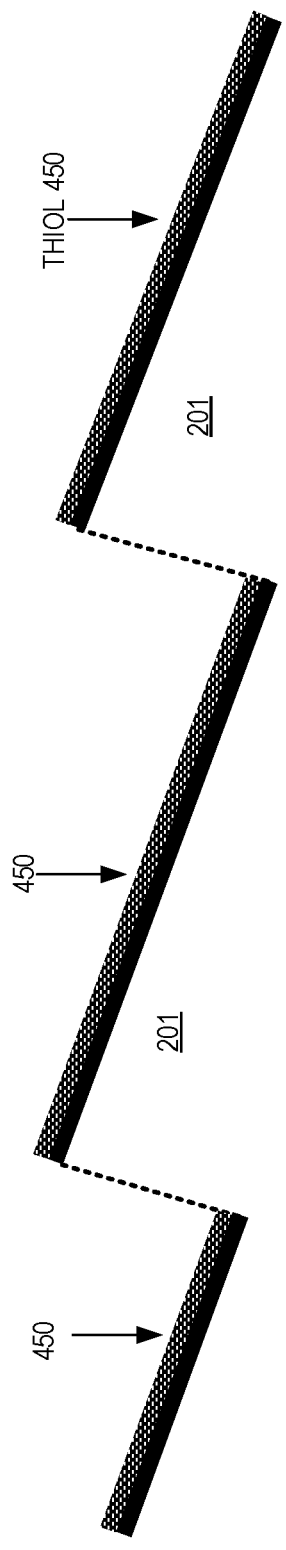

FIG. 4C illustrates optical element 400 after the thiol layer 450 is formed on the active surfaces 215 of optical element 400. The draft surfaces 213 remain bare, in the illustrated embodiment.

Figure 4D:
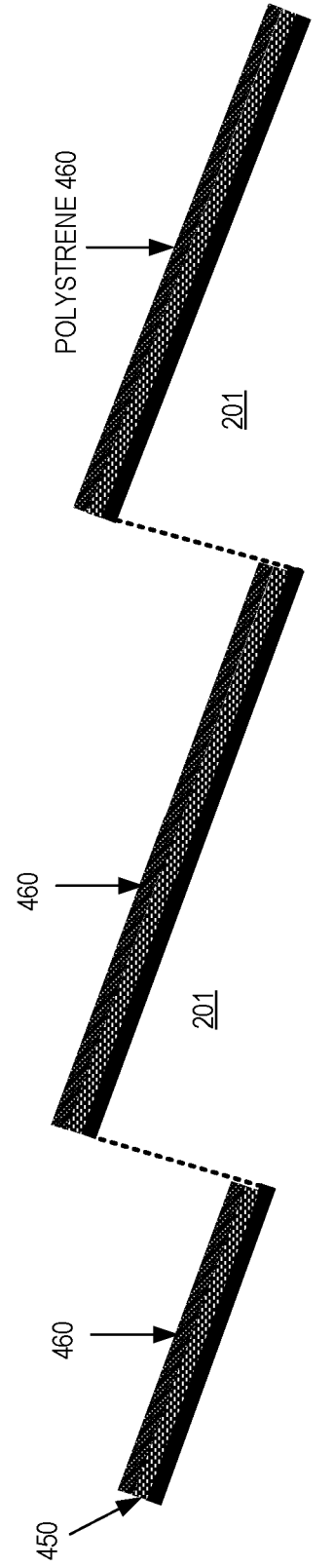

In FIG. 4D, a polystyrene layer 460 is bonded to the thiol layer 450 disposed on the active surface 215 of the Fresnel features. The refractive materials 201 repels polystyrene so the exposed draft surfaces 213 may repel polystyrene even when a polystyrene coating is applied indiscriminately to both the draft surfaces 213 and the active surfaces 215 of optical element 400. In contrast, the thiol layer 450 provides a bond to retain the polystyrene layer 450 to the active surfaces 215.

In one embodiment, a layer of polystyrene is spin coated onto optical element 400. Since the optical element 400 is spinning, the polystyrene slides off of the refractive material 201 that is exposed on the draft surface 213 due to centrifugal force while the polystyrene bonds with the thiol layer 450 that is disposed over the active surfaces 215.

In FIG. 4E, a light absorptive layer 470 is disposed over the draft surfaces 213 and over the polystyrene layer 460 that is disposed over the active surfaces 215. Light absorptive layer 470 may include the properties of light absorptive layer 230.

In FIG. 4F, the thiol layer 450 that is disposed over the active surfaces 215 has been removed, and consequently, the polystyrene layer 460 and the portion of light absorptive layer 470 that was disposed over the polystyrene layer 460 have also been removed. Therefore, Fresnel optical element 400 in FIG. 4F is left with portions 473 of light absorptive layer 470 disposed over draft surfaces 213 and not disposed over active surfaces 215. In one embodiment, removing thiol layer 450 includes rinsing optical element 400 in a thiol-removing solution.

In the embodiment illustrated in FIGS. 4A-4F, the polystyrene layer essentially acts to mask the active surfaces 215 so that the light absorptive layer 470 can be applied to the draft surfaces 213. In a different embodiment (not illustrated), a thiol layer is selectively applied to the draft surfaces 213 but not the active surfaces 215 of optical element 400. Subsequently, a black colored polystyrene layer (that is light absorptive) is applied to optical element 400 and the black colored polystyrene bonds to the thiol layer that is disposed on the draft surfaces while the black colored polystyrene layer is repelled from the exposed refractive material 201 of active surfaces 215. Hence, in this embodiment, the draft surfaces are covered by a thiol layer and a black polystyrene layer (serving as a light absorptive layer) bonds to the thiol layer while the active surfaces 215 are bare to retain their lensing function.

Figure 5A:
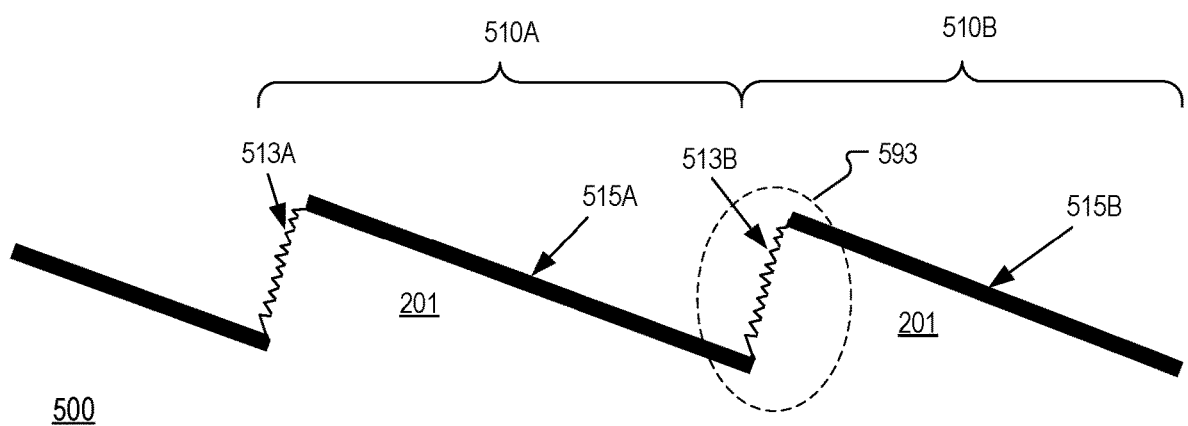
FIGS. 5A-5E illustrate an example process of fabricating a Fresnel optical element having texturized draft surfaces, in accordance with an embodiment of the disclosure.

FIGS. 5A-5E illustrate an example process of fabricating a Fresnel optical element 500 having texturized draft surfaces, in accordance with an embodiment of the disclosure. FIG. 5A illustrates a Fresnel surface that includes Fresnel features 510A and 510B. Fresnel feature 510A includes a draft surface 513A and an active surface 515A. Fresnel feature 510B includes a draft surface 513B and an active surface 515B. The Fresnel features 510 are formed in a refractive material 201, in FIG. 5A.

Figure 5B:
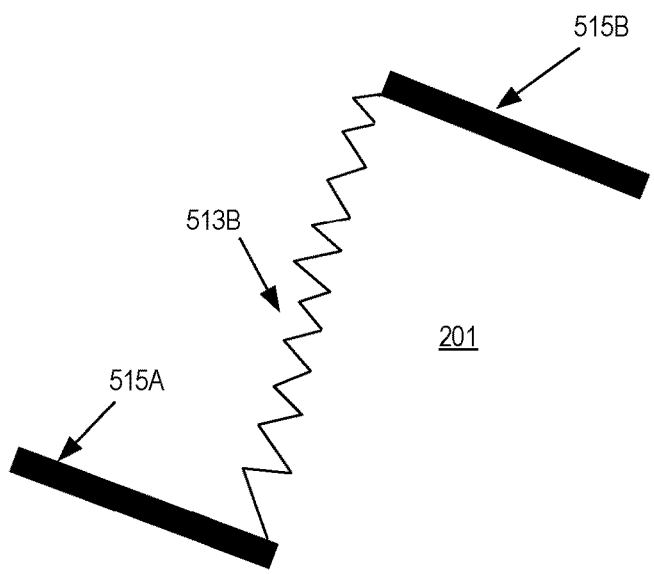

FIG. 5B illustrates a zoomed-in view 593 of the optical element 500 of FIG. 5A. In FIG. 5B, texturized draft surface 513B is texturized while active surfaces 515A and 515B are smooth. Each of the draft surfaces 513 of optical element 500 may be texturized similar to draft surface 513B illustrated in FIG. 5B.

In one embodiment, the texturized draft surfaces 513 are formed in a molding process. In this embodiment, a refractive material 201 may be injected into a molding tool that generates the illustrated Fresnel surface where the molding tool is fabricated to impart the texturized draft surfaces to the Fresnel features of optical element 500. In other words, the molding tool may include the reverse profile of the texture profile imparted to the draft surfaces 513 and also include the reverse profile of the smooth surface imparted to the smooth active surfaces 515.

In one embodiment, the texturized draft surfaces 513 are formed with an etching process. In this embodiment, the smoothed active surfaces 515 are coated with a masking layer. Subsequently, the draft surfaces are exposed to an etchant that etches the exposed draft surfaces to generate texturized draft surfaces 513. The masking layer protects that active surfaces 515 from the etchant and they are not texturized by the etchant. Once the etchant is removed (e.g. optical element 500 is removed from an etching bath), the masking layer is removed so that the refractive material 201 of the active surfaces 515 are once again exposed and the draft surfaces 513 are texturized.

Figure 5C:
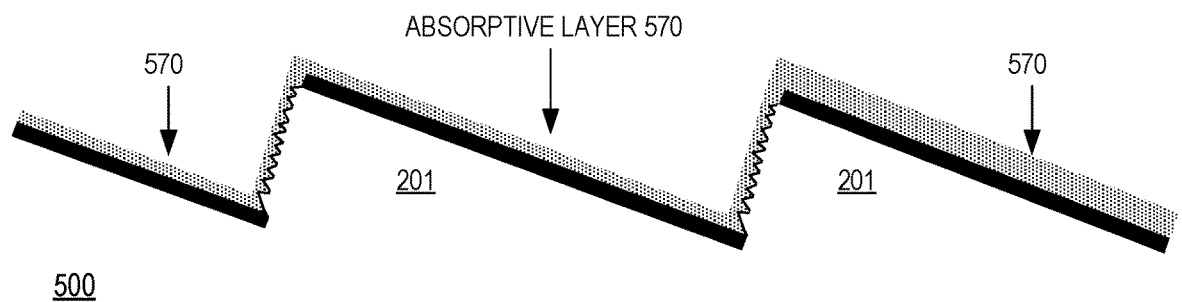

In FIG. 5C, a light absorptive layer 570 is formed on the Fresnel surface of optical element 500. Light absorptive layer 570 may include the properties of light absorptive layer 230. In one embodiment, forming the light absorptive layer 570 on the Fresnel surface includes spin coating the light absorptive layer 570 onto the Fresnel optical element 500. In one embodiment, forming the light absorptive layer 570 on the Fresnel surface includes dip coating the Fresnel optical element 500 in a light absorptive material.

Figure 5D:
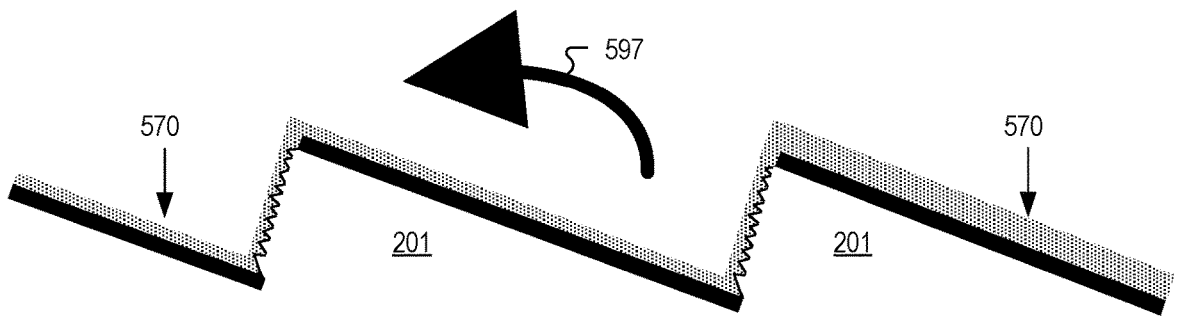
Figure 5E:

In FIG. 5D, optical element 500 is rotated in a direction 597 about its central axis. The rotation is at a speed that retains the light absorptive layer 570 on the texturized draft surfaces 513 and expels the light absorptive layer 570 from the smoothed active surfaces 515. The smooth surfaces of the active surfaces 515 may allow the light absorptive layer 570 to slide off of the active surfaces 515 during rotation while the texturized surface (providing increased surface area) as well as the angle of texturized draft surfaces 513 (relative to the rotation direction 597) are configured to retain the light absorptive layer 570, as shown in FIG. 5E. Light absorptive layer 570 may include a black coating material or a photoresist material that is light absorptive.

Figure 6:
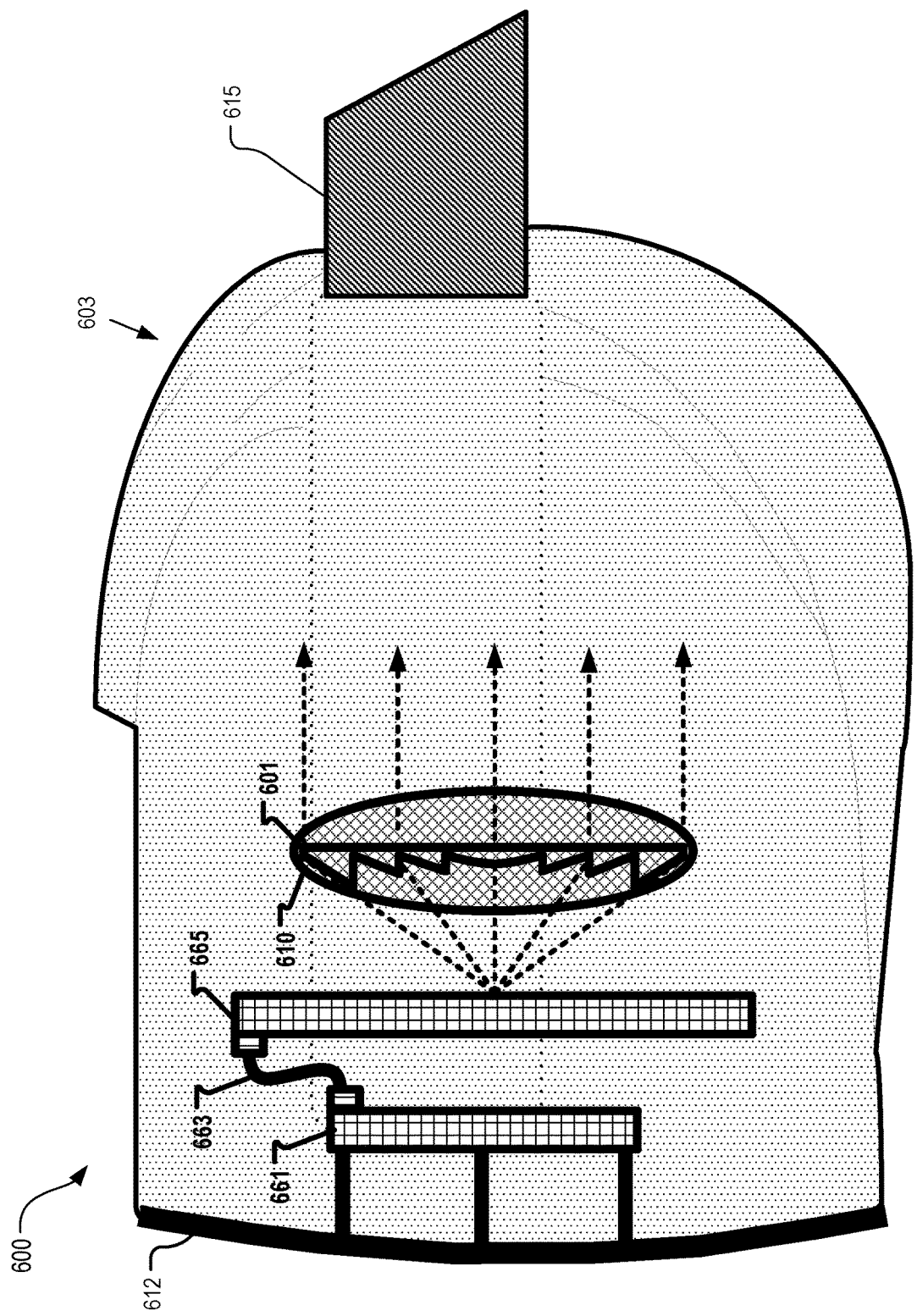
FIG. 6 illustrates an example head mounted display that includes a Fresnel optical element, in accordance with an embodiment of the disclosure.

In disclosed embodiments, a Fresnel optical element is generated where a light absorptive layer is selectively disposed over the draft surfaces and not the active surfaces. Ray tracing simulations and testing on disclosed embodiments suggest that this configuration reduces glare, suppresses double images, and generally produces sharper images, when included in optical systems. FIG. 6 illustrates one example optical system that the embodiments of FIGS. 1A-5E may be utilized in.

FIG. 6 illustrates an example head mounted display (HMD) viewing structure 603 that includes a Fresnel optical element 601, in accordance with an embodiment of the disclosure. HMD viewing structure 603 also includes a mainboard 661 coupled to drive a display 665 via flex circuit 663. Lens assembly 610 that includes Fresnel optical element 601 is configured to create a virtual image viewed by an eye of a wearer of HMD viewing structure 603 by collimating image light generated from the display 665. In the illustrated embodiment, the Fresnel surface of Fresnel optical element 601 is on a display side of the Fresnel optical element 601, but in some embodiments, the Fresnel surface of the Fresnel optical element 601 may be on an eye side (opposite the display side) of the Fresnel optical element

601. Fresnel optical element 601 may incorporate embodiments of the disclosure described in association with FIGS. 1A-5E.

The illustrated embodiment of HMD viewing structure 603 also includes a chassis 612 and a head strap 615 (only partially illustrated) to secure the HMD viewing structure 603 to a head of a wearer.

Mainboard 661 may include processors such as central processing units (CPUs) and/or graphics processing units (GPU). Flexible circuit board 663 is coupled to deliver image signals (such as video data) from the mainboard 661 to the display 665. Display 665 may be a liquid crystal display (LCD), organic light emitting diode (OLED) display, quantum dot display, micro-LED display, Liquid Crystal on Silicon (LCOS) display, or otherwise.

Although HMD viewing structure 603 is illustrated as conducive to Virtual Reality (VR) experiences, it is appreciated that the disclosed Fresnel optical elements may also be used to in Augmented Reality (AR) or Mixed Reality (MR) systems.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A Fresnel lens comprising:
   a refractive material;
   a Fresnel surface formed in the refractive material, wherein the Fresnel surface includes a plurality of Fresnel features that include an active surface and a draft surface; and
   a light absorptive layer selectively disposed over the draft surface of the Fresnel features, wherein the light absorptive layer is configured to absorb a majority of visible light encountering the light absorptive layer, wherein a thiol layer is disposed between the light absorptive layer and the draft surface of the Fresnel features.

2. The Fresnel lens of claim 1, wherein the draft surface of the Fresnel features is texturized to retain the light absorptive layer.

3. The Fresnel lens of claim 1, wherein the light absorptive layer includes a photoresist material.

4. The Fresnel lens of claim 1, wherein the light absorptive layer includes a black polystyrene.

5. The Fresnel lens of claim 1, wherein the Fresnel lens is rotationally symmetrical around a central axis of the Fresnel lens.

6. The Fresnel lens of claim 5, wherein the Fresnel features increase in size as a distance of the Fresnel features increases from the central axis.

7. The Fresnel lens of claim 1, wherein the refractive material includes poly-methyl-methacrylate (PMMA).

8. The Fresnel lens of claim 1, wherein the light absorptive layer possesses a matte finish.

9. A method of fabricating a Fresnel optical element, the method comprising:
   forming a photoresist layer on a Fresnel surface that includes a plurality of Fresnel features having an active surface and a draft surface;
   rotating the Fresnel optical element about a central axis of the Fresnel optical element;
   activating a controlled light source to selectively remove the photoresist layer from the draft surface of the Fresnel features, wherein the controlled light source is activated while the Fresnel optical element is rotated about the central axis;
   applying a light absorptive layer to the Fresnel features, wherein the light absorptive layer is disposed over the photoresist layer disposed on the active surface of the Fresnel features; and
   removing the photoresist layer, wherein removing the photoresist layer includes removing the light absorptive layer from above the active surface and retaining the light absorptive layer disposed on the draft surface.

10. The method of claim 9, wherein the controlled light source is angled to illuminate the draft surface and not the active surface.

11. The method of claim 9, wherein the controlled light source is angled to illuminate the active surface of the Fresnel features and not the draft surface of the Fresnel features.

12. A method of fabricating a Fresnel optical element, the method comprising:
   forming a Fresnel surface that includes a plurality of Fresnel features having a smoothed active surface and a texturized draft surface;
   forming a light absorptive layer on the Fresnel surface; and
   rotating the Fresnel optical element about a central axis of the Fresnel optical element, wherein the Fresnel optical element is rotated at a speed for retaining the light absorptive layer on the texturized draft surface and expelling, with centrifugal force, the light absorptive layer from the smoothed active surface of the Fresnel features.

13. The method of claim 12, wherein forming the light absorptive layer on the Fresnel surface includes spin coating the light absorptive layer onto the Fresnel optical element.

14. The method of claim 12, wherein forming the light absorptive layer on the Fresnel surface includes dip coating the Fresnel optical element in a light absorptive material.

15. The method of claim 12, wherein forming the Fresnel surface that includes a plurality of Fresnel features having the smoothed active surface and the texturized draft surface includes:
   coating the smoothed active surface with a masking layer;
   etching a draft surface of the Fresnel surface to generate the texturized draft surface; and
   removing the masking layer.

16. The method of claim 12, wherein forming the Fresnel surface that includes a plurality of Fresnel features having the smoothed active surface and the texturized draft surface includes injecting a refractive material into a molding tool that generates the Fresnel surface, wherein the molding tool imparts the texturized draft surface to the Fresnel features.

17. The method of claim 16, wherein the molding tool includes a reverse profile of the texturized draft surface.

18. The method of claim 12, wherein the light absorptive layer includes a photoresist material.

\* \* \* \* \*